(12) United States Patent
Kim et al.

(10) Patent No.: US 11,287,323 B2
(45) Date of Patent: Mar. 29, 2022

(54) SEMICONDUCTOR SUBSTRATE MEASURING APPARATUS, SEMICONDUCTOR SUBSTRATE PROCESSING APPARATUS AND SEMICONDUCTOR DEVICE MANUFACTURING METHOD USING THE SAME

(71) Applicant: Samsung Electronics Co., Ltd., Suwon-si (KR)

(72) Inventors: Hoonseop Kim, Suwon-si (KR); Vladmir Protopopov, Suwon-si (KR); Minju Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 25 days.

(21) Appl. No.: 17/003,197

(22) Filed: Aug. 26, 2020

(65) Prior Publication Data

US 2021/0102841 A1 Apr. 8, 2021

(30) Foreign Application Priority Data

Oct. 7, 2019 (KR) .................. 10-2019-0123680

(51) Int. Cl.
*G01J 3/45* (2006.01)
*H01L 21/66* (2006.01)
(Continued)

(52) U.S. Cl.
CPC ............ *G01J 3/45* (2013.01); *G01N 21/8422* (2013.01); *G01N 21/9501* (2013.01);
(Continued)

(58) Field of Classification Search
None
See application file for complete search history.

(56) References Cited

U.S. PATENT DOCUMENTS 7,601,272 B2 10/2009 Nguyen et al.
9,076,827 B2 * 7/2015 Bour ................. H01L 33/06
(Continued)

FOREIGN PATENT DOCUMENTS

KR 100782424 B1 12/2007
KR 20170038219 A 4/2017
KR 101821276 B1 1/2018

OTHER PUBLICATIONS

Yu, F. U. Z. H. O. N. G., et al. "In-situ monitoring of epitaxial film thickness by IEMI." IEEE transactions on semiconductor manufacturing 5.1 (1992): 34-40 (Year: 1992).*

*Primary Examiner* — Shawn Decenzo
(74) *Attorney, Agent, or Firm* — Harness, Dickey & Pierce, P.L.C.

(57) ABSTRACT

A semiconductor substrate processing apparatus includes a transfer chamber disposed between process chambers performing processing of a semiconductor substrate, a transfer robot disposed inside the transfer chamber to load the semiconductor substrate into the process chamber and unload the semiconductor substrate whose processing has been performed in the process chamber, an optical assembly irradiates irradiation light having multiple wavelengths onto the semiconductor substrate, the optical assembly splitting measurement light reflected from a surface of the semiconductor substrate into first and second measurement light and collecting interference light caused by first reflected light and second reflected light, a light detector detecting the interference light and converting the interference light into an electric signal to produce an interference signal, and a controller extracting spectrum information for each wavelength of the measurement light from the interference signal and calculating distribution information of a film formed on the semiconductor substrate.

20 Claims, 8 Drawing Sheets

(51) Int. Cl.
*G01N 21/84* (2006.01)
*G01N 21/95* (2006.01)
*G01N 21/45* (2006.01)

(52) U.S. Cl.
CPC .............. H01L 22/10 (2013.01); H01L 22/12 (2013.01); *G01N 21/45* (2013.01)

(56) References Cited

U.S. PATENT DOCUMENTS

| | | | | |
|---|---|---|---|---|
| 2005/0174583 | A1* | 8/2005 | Chalmers | G01N 21/55 356/630 |
| 2006/0141795 | A1* | 6/2006 | Negishi | H01L 21/31116 438/706 |
| 2006/0157445 | A1* | 7/2006 | Mochiki | H01L 21/67253 216/59 |
| 2009/0146145 | A1* | 6/2009 | Sasahara | H01L 22/12 257/48 |
| 2011/0199476 | A1 | 8/2011 | Ravid et al. | |
| 2011/0308453 | A1 | 12/2011 | Su et al. | |
| 2014/0022546 | A1* | 1/2014 | Nagai | G01J 3/4535 356/326 |
| 2014/0295583 | A1* | 10/2014 | Nakamoto | G01B 11/0616 438/16 |
| 2015/0221562 | A1* | 8/2015 | Torikoshi | H01L 22/12 438/692 |
| 2017/0148654 | A1* | 5/2017 | Paul | H01L 21/68707 |
| 2018/0372652 | A1 | 12/2018 | Immer et al. | |
| 2019/0139791 | A1* | 5/2019 | Kiyose | H01L 21/02101 |
| 2020/0139503 | A1* | 5/2020 | Kodama | H01L 21/304 |
| 2021/0226182 | A1* | 7/2021 | Tung | H01L 51/001 |
| 2021/0285096 | A1* | 9/2021 | Shinada | G01S 7/4814 |

* cited by examiner

SEMICONDUCTOR SUBSTRATE MEASURING APPARATUS, SEMICONDUCTOR SUBSTRATE PROCESSING APPARATUS AND SEMICONDUCTOR DEVICE MANUFACTURING METHOD USING THE SAME

CROSS-REFERENCE TO RELATED APPLICATION(S)

This application claims the benefit of the Korean Patent Application No. 10-2019-0123680 filed on Oct. 7, 2019, with in the Korean Intellectual Property Office, the disclosure of which is incorporated herein by reference in its entirety.

BACKGROUND

1. Field

The present disclosure relates to a semiconductor substrate measuring apparatus, a semiconductor substrate processing apparatus and/or a semiconductor device manufacturing method using the same.

2. Description of Related Art

Manufacturing processes of a semiconductor device includes forming a film on a semiconductor substrate and processing the same. Each process may include measuring a state of the film formed on the semiconductor substrate, which is performed in separate measuring equipment. Accordingly, a gap may occur between a time at which the film is measured to detect an abnormality and a time at which the detection results are reflected in the process, thereby leading to a significant amount of loss in manufacturing costs.

SUMMARY

An aspect of the present disclosure is to provide a semiconductor substrate measuring apparatus capable of simultaneously detecting a state of a film formed on a semiconductor substrate moving inside a transfer chamber, a semiconductor substrate processing apparatus using the same, and a semiconductor substrate device manufacturing method.

In one embodiment, a semiconductor substrate processing apparatus includes process chambers configured to process a semiconductor substrate; a transfer chamber between the process chambers and configured to provide a transfer path of the semiconductor substrate; a transfer robot inside the transfer chamber; an optical assembly over the transfer path; a light detector; and a controller. The transfer robot may be configured to load the semiconductor substrate into the process chamber and unload the semiconductor substrate from the process chamber after processing has been performed on the semiconductor substrate in the process chamber. The optical assembly may be configured to irradiate irradiation light having multiple wavelengths onto the semiconductor substrate. The optical assembly may be configured to split measurement light reflected from a surface of the semiconductor substrate into first measurement light and second measurement light. The optical assembly may be configured to collect interference light caused by first reflected light and second reflected light. The first reflected light may be formed of the first measurement light reflected by a fixed reflector and the second reflected light formed of the second measurement light reflected by a linearly moving reflector. The light detector may be configured to detect the interference light and convert the interference light into an electric signal to produce an interference signal. The controller may be configured to extract spectrum information for each wavelength of the measurement light from the interference signal using a distance value of a linear movement of the linearly moving reflector and may be configured to calculate distribution information of a film on a surface of the semiconductor substrate based on the spectrum information.

In one embodiment, a semiconductor substrate measuring apparatus includes a light source device, a transfer chamber, a first optical assembly, a second optical assembly, a light detector, and a controller. The light source device may be configured to produce irradiation light of multiple wavelengths. The transfer chamber may have an internal space and may be configured to have a semiconductor substrate transferred therein. The first optical assembly may be at an upper end of the transfer chamber. The first optical assembly may be configured to irradiate the irradiation light onto the semiconductor substrate and to collect measurement light reflected from a surface of the semiconductor substrate. The second optical assembly may be configured to split the measurement light into first measurement light and second measurement light, collect first reflected light formed of the first measurement light reflected by a fixed reflector and second reflected light formed by reflecting the second measurement light by a moving reflector performing a reciprocating movement in a desired and/or alternatively predetermined distance. The light detector may be configured to detect interference light caused by the first reflected light and the second reflected light. The light detector may be configured to convert the interference light to an electric signal to produce an interference signal. The controller may be configured to extract spectrum information for each wavelength of the measurement light from the interference signal using a distance value of a linear movement of the moving reflector and the controller being configured to calculate distribution information of a film formed on a surface of the semiconductor substrate based on the spectrum information.

In one embodiment, a method for manufacturing a semiconductor device includes transferring a semiconductor substrate to a transfer chamber; loading the semiconductor substrate into a process chamber; forming a film on the semiconductor substrate by processing the semiconductor substrate in the process chamber; unloading the semiconductor substrate from the process chamber; irradiating irradiation light onto the semiconductor substrate and collecting measurement light reflected on the semiconductor substrate; splitting the measurement light into first measurement light and second measurement light; collecting first reflected light and second reflected light, the first reflected light formed of the first measurement light reflected by a fixed reflector, and the second reflected light formed of the second measurement light reflected by a linearly moving reflector; detecting interference light caused by the first reflected light and the second reflected light; converting the detected interference light into an electric signal to generate an interference signal; extracting spectrum information for each wavelength of the measurement light from the interference signal using a distance value of a linear movement of the linearly moving reflector; and calculating distribution information of the film on the surface of the semiconductor substrate based on the spectrum information.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings.

Figure 1:
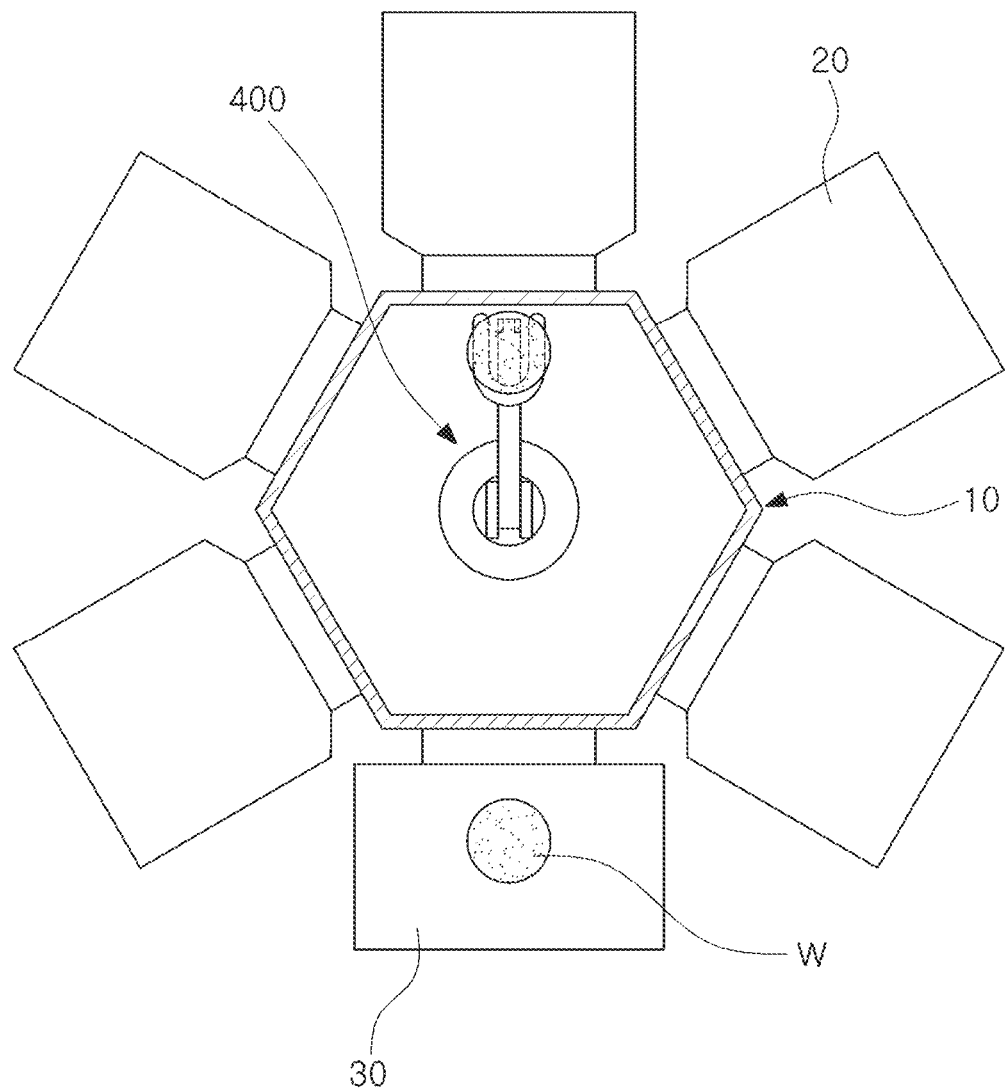
FIG. 1 is a top view of a semiconductor substrate processing apparatus according to an example embodiment of the present disclosure.
Figure 2:
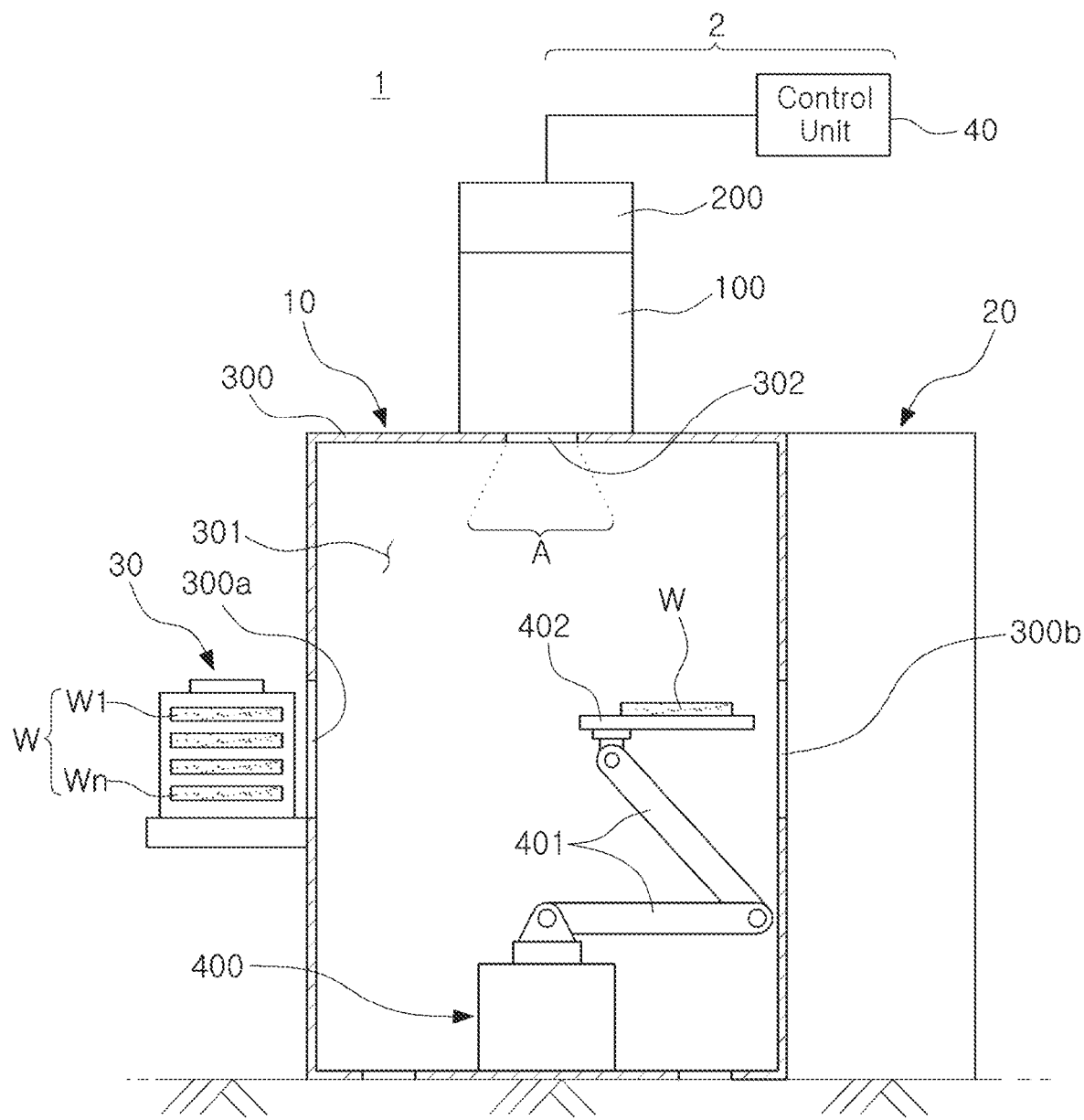
FIG. 2 is a side view of the semiconductor substrate processing apparatus of FIG. 1.
Figure 3:
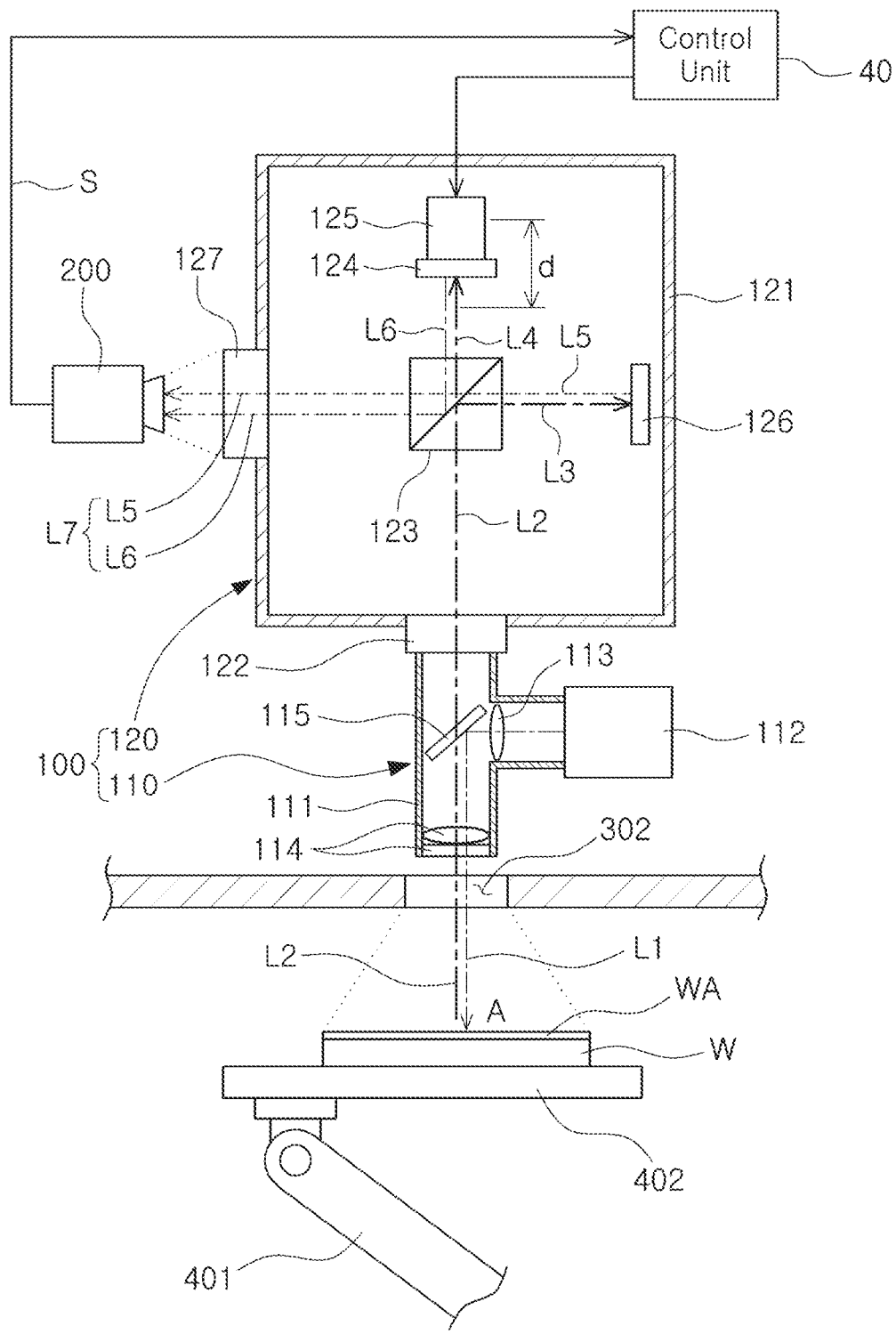
FIG. 3 is an enlarged view of a semiconductor substrate measuring apparatus of the semiconductor substrate processing apparatus of FIG. 2.
Figure 4:
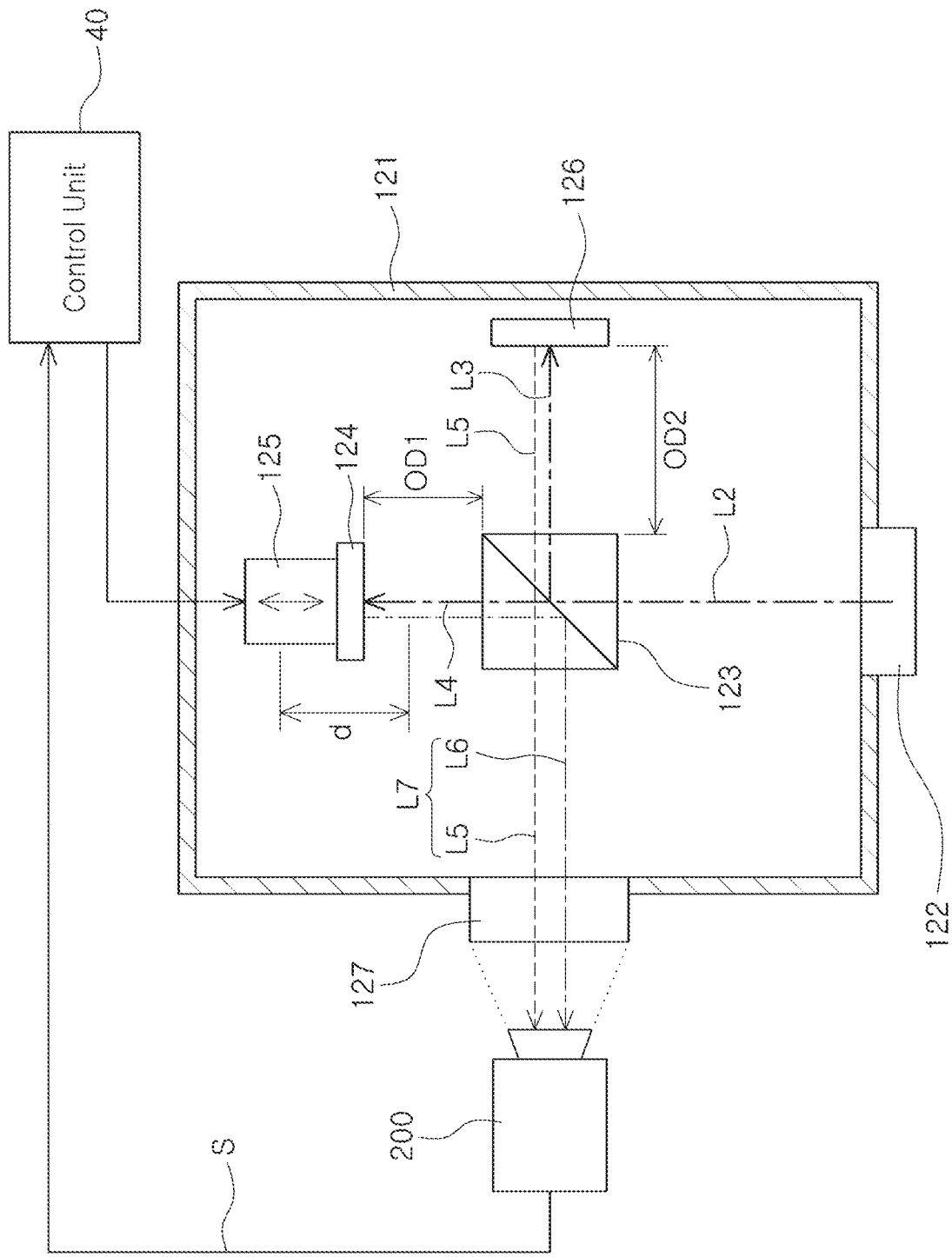
FIG. 4 is a diagram illustrating a process of measuring the semiconductor substrate processing apparatus of FIG. 2.

A semiconductor substrate processing apparatus according to an example embodiment will be described with reference to FIGS. 1 to 4. FIG. 1 is a top view of a semiconductor substrate processing apparatus according to an example embodiment of the present disclosure, and FIG. 2 is a side view of the semiconductor substrate processing apparatus of FIG. 1. FIG. 3 is an enlarged view of a semiconductor substrate measuring apparatus of the semiconductor substrate processing apparatus of FIG. 2, and FIG. 4 is a diagram illustrating a process of measuring the semiconductor substrate processing apparatus of FIG. 2.

Referring to FIGS. 1 and 2, a semiconductor substrate processing apparatus 1 according to an example embodiment may include a transfer chamber 10 around which at least one process chamber 20 is disposed, a transfer robot 400 disposed inside the transfer chamber 10 and configured for loading and unloading a wafer W into/from a process chamber 20, and a semiconductor substrate measuring apparatus 2 disposed at an upper end of the transfer chamber 10 and configured for measuring a state of a surface of the wafer W.

The transfer chamber 10 may be disposed between the process chamber 20 configured to perform a desired and/or alternatively predetermined process for a semiconductor substrate such as the wafer W and a loading assembly 30 in which the wafer W is loaded to provide a transfer path of the wafer W. For example, the process chamber 20 may perform processes of forming a film on the wafer W and processing the formed film, such as chemical vapor deposition, etching, photo cleaning, and the like.

The loading assembly 30 may load wafers W thereinside. A plurality of wafers W1 to Wn may be loaded into the loading assembly 30 in vertical direction. The loading assembly 30 may have a sealed structure having a door so as to limit and/or prevent external air from inflowing. In an embodiment, the loading assembly 30 the wafers W1 to Wn may be loaded into a cassette in a pod and may be transported into a load lock chamber, but example embodiments are not limited thereto.

When viewed from an upper side, the transfer chamber 10 may be configured to have a plurality of process chambers 20 and loading assemblies 30 circumferentially disposed. The transfer chamber 10 may have an internal space 301 defined by an external wall 300. In one region of the external wall 300, a first door 300a and a second door 300b, which are connected to the loading assembly 30 and the process chamber 20, respectively, may be disposed.

The transfer robot 400 may extract the wafer W loaded into the loading assembly 30 and load the same into the process chamber 20, followed by loading the wafer W processed into the process chamber 20 in the loading assembly 30. According to an example embodiment, the transfer robot 400 may unload the wafer W processed in the process chamber 20 to load into another process chamber 20.

The transfer robot 400 may have a multistage arm 401, and an arm spoon 402 in which a wafer W is sit may be disposed in an end portion. When the first door 300a is open, the transfer robot 400 selects a wafer requiring processing among the wafers W loaded into the loading assembly 30 and loads the same into the arm spoon 402. When the second door 300b is open, the transfer robot 400 may load the loaded wafer W into a process chamber 20. Further, the transfer robot 400, once the process of the wafer W is completed in the process chamber 20, unloads the wafer W from the process chamber 20 and re-loads into the loading assembly 30.

In the case in which a plurality of the wafers W1 to Wn are disposed vertically, a plurality of the wafers W1 to Wn are horizontally transferred in the transfer chamber 10 while having a height difference. Further, during the transfer of the wafer W, the arm spoon 402 may vertically vibrate by vibration of the arm 401, thereby giving rise to a height difference in a position to which the wafer W is transferred. Due to such a height difference, it may be difficult to measure a state of a surface of the wafer W when the wafer W is being transferred inside the transfer chamber 10. In particular, in the case of a semiconductor substrate measuring apparatus employing an interferometer using white light as a light source, the wafer W may need to be disposed at a position where an optical path of the wafer W to a mirror inside the interferometer is within a coherence length in order to measure a state of the surface of the wafer W. As the coherence length is inversely proportional to a wavelength width of the light source, the interferometer using the white light as a light source has a significantly short coherence length. In this regard, a state of the surface of the wafer W cannot be measured when a height difference or vibration occurs during the wafer W transfer. Accordingly, the semiconductor substrate measuring apparatus employing an interferometer using white light as a light source was not used in measuring the state of the wafer W surface when the wafer W was being transferred inside the transfer chamber 10.

Based on FIG. 3, the optical assembly 100 may include a first optical assembly 110 and a second optical assembly 120.

The first optical assembly 110 may be disposed at an upper end of the transfer chamber 10. The first optical assembly 110 may be configured to irradiate irradiation light L1 to the wafer W passing through a lower region A through an observation window 302 of the transfer chamber 10 and collect measurement light L2 reflected on the surface of the wafer W.

The first optical assembly 110 may have a first body portion 111 having an exterior shape.

A first lens portion 114 may be disposed at a front end of the first body portion 111, that is, in a direction in which the irradiation light L1 is irradiated, so that the irradiation light L1 is irradiated through the observation window 302 and measurement light L2 is collected. The irradiation light L1 may be irradiated on the surface of the wafer W at a time point at which the wafer W sits on the arm spoon passes through the lower region A of the first optical assembly 110. The irradiation light L1 may be irradiated so as to light an entire upper surface of the wafer W in which a film WA is formed. Accordingly, the measurement light L2 may contain an image of the upper surface of the wafer W. The first lens portion 114 may include a single lens or a plurality of lenses. For example, the first lens portion 114 may include a condensing lens for collecting the measurement light L2 in the second optical assembly 120, and a wide-angle lens for collecting the measurement light L2 in a wide angle.

The first body portion 111 may be linked to a light source device 112 configured to irradiate the irradiation light L1. The light source device 112 may be configured irradiate light of multiple wavelengths, such as white light. The light source device 112 may include a light source lamp, and various members, which emit light, such as a xenon lamp, a tungsten halogen lamp, or a white light emitting diode, may be employed as the light source lamp. In an example embodiment, a xenon lamp irradiating light of a broad band wavelength in the wavelength range of 220 nm to 2000 nm may be used as the light source lamp. The light source device 112 may include a collimator lens 113 converting light contracted by the light source lamp into parallel light.

At a rear end of the first lens portion 114, a light splitter 115 (e.g., reflective films or prisms having different refractive indices such as a beam splitting cube, a beam splitter, a polarizing beam splitter and/or a Wollaston prism) capable of reflecting the irradiation light L1 irradiated from the light source device 112 to irradiate to the first body portion 111 and transmitting the measurement light L2 incident through a lens portion 220 may be disposed.

The second optical assembly 120 may be linked to the first optical assembly 110. A second lens portion 122 for collecting the measurement light L2 in the second optical assembly may be disposed in the second optical assembly 120.

The second optical assembly 120 may have a second body portion 121 configuring an exterior shape. A light splitter 123 dividing the light collected in the first optical assembly into first and second measurement light L3 and L4 inside the second body portion 121. Further, a fixed reflector 126 and a moving reflector 124 reflecting the first and second measurement light L3 and L4, respectively, may be disposed in the second body portion 121.

The light splitter 123 may divide the measurement light L2 into the first and second measurement light L3 and L4, which cross each other. The light splitter 123 may include a plurality of reflective films or prisms having different refractive indices. The light splitter 123 may include, for example, a beam splitting cube, a beam splitter, a polarizing beam splitter and/or a Wollaston prism. In an example embodiment, the light splitter 123 may be a beam splitting cube. The light splitter 123 may have a same ratio of reflection and transmission. Accordingly, the first and second measurement light L3 and L4 divided by the light splitter 123 may have a same amount of light.

The first and second measurement light L3 and L4 divided from the light splitter 123 may be reflected by the fixed reflector 126 and the moving reflector 124, respectively, and meet in the light splitter 123 to face a direction in which the light detector 200 is disposed. The light reflected by the fixed reflector 126 is defined as a first reflected light L5, and the light reflected by the moving reflector 124 is defined as a second reflected light L6.

The fixed reflector 126 and the moving reflector 124 may be disposed so as to reflect the first and second measurement light L3 and L4 and incident the same in the light splitter 123. The fixed reflector 126 and the moving reflector 124 may include at least one of a planar mirror and a retroreflector. The fixed reflector 126 and the moving reflector 124 may be spaced apart from the light splitter 123 in equivalent optical distances OD1 and OD2. Accordingly, in the case in which the moving reflector 124 does not move or passes a point, at which the optical distance is the same as that of the fixed reflector 126, the first and second measurement light L3 and L4 reflected by the fixed reflector 126 and the moving reflector 124 and incident to the light splitter 123 may have a same phase.

The moving reflector 124 may reciprocate a desired and/or alternatively predetermined distance d based on an optical distance the same as that of the fixed reflector. In this case, the first and second measurement light L3 and L4 reflected by the fixed reflector 126 and the moving reflector 124 and incident to the light splitter 123 may have different phases.

The moving reflector 124 may linearly reciprocate along an optical axis direction of the second measurement light L2. The moving reflector 124 may be operated by a linear stage 125 including at least one of a piezo motor and a voice coil motor.

The moving reflector 124 may reciprocate a desired and/or alternatively predetermined distance d at a constant speed. In an example embodiment, the moving reflector 124 may reciprocate a distance of about 300 μm at an interval of 1 sec.

The second reflected light L6 reflected by the reciprocating moving reflector 124 has a different phase from the first reflected light L5 due to a light path difference. Accordingly, the first and second reflected light L5 and L6 meet in the light splitter 123 and form interference light L7 facing a direction in which the light splitter 123 is disposed. A third lens portion 127 for collecting the interference light L7 in the light detector 200 may be disposed in the second optical assembly 120.

A light detector 200 detecting the interference light K7 and converting the same to an electric signal may be disposed in a side portion of the second optical assembly. In an example embodiment, the light detector 200 is described as being disposed in the side portion of the second optical assembly 120, but is not limited thereto. The light detector 200 may be disposed in an upper portion of the second optical assembly 120.

Figure 5:
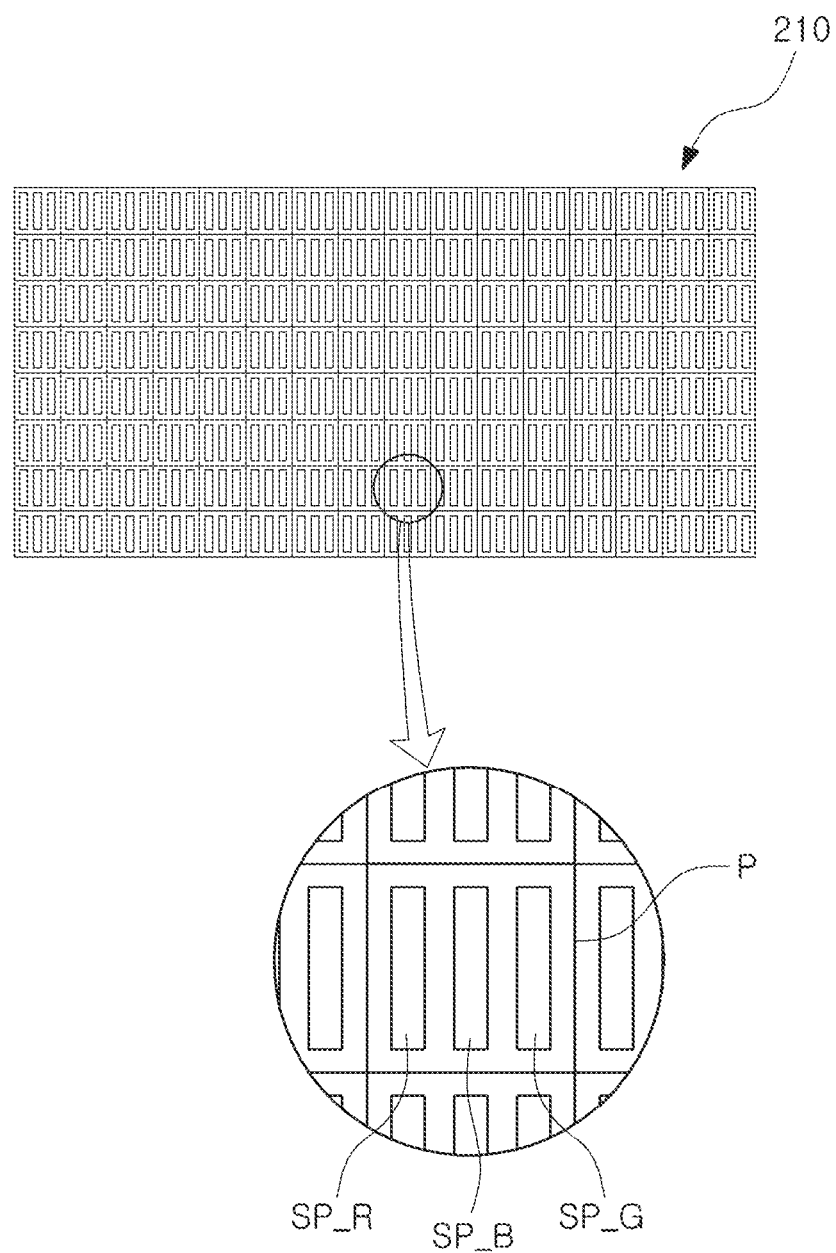
FIG. 5 is a diagram illustrating an imaging surface of a light detector of FIG. 4.
Figure 6:
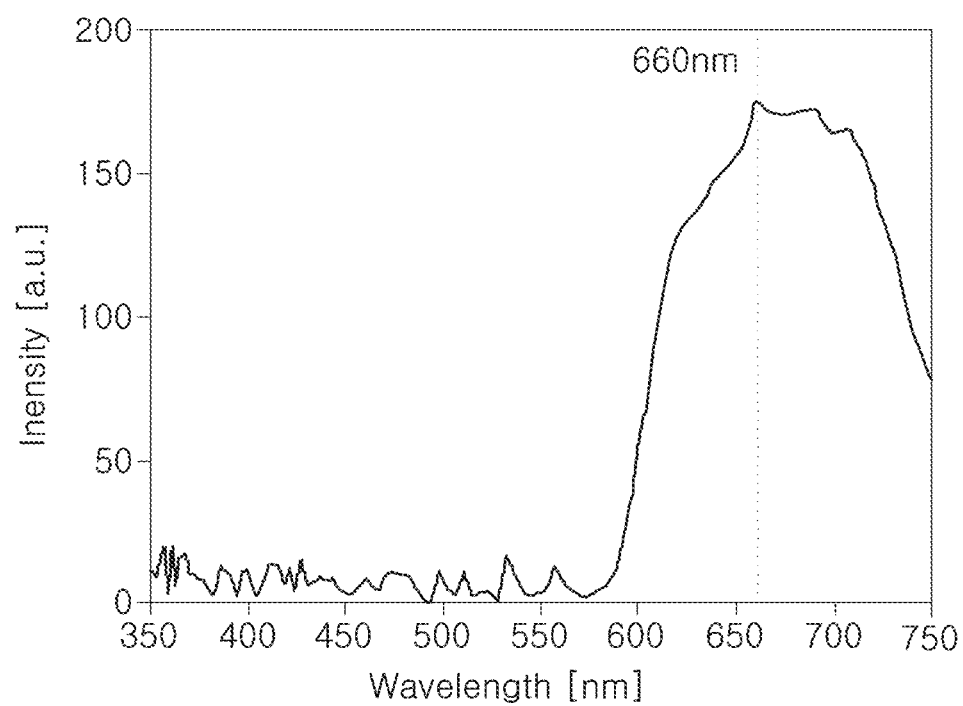
FIG. 6 is a diagram illustrating a spectrum extracted from an interference signal detected from a sub pixel of one pixel of a plurality of pixels consisting of the imaging surface of FIG. 4.

The light detector 200 may provide an interference signal S to the controller 40 based on the interference light L7. For example, the interference signal S may be a voltage signal, a current signal or a digital signal corresponding to a change in intensity or frequency of the interference light L7. The light detector 200 may include an imaging device for converting a detected light signal to an electric signal. The imaging device may include at least one of a charge coupled device (CCD) sensor and a complementary metal-oxide semiconductor (CMOS) sensor. As illustrated in FIG. 5, the imaging device 210 may include a plurality of pixels P, and each pixel P may consist of a plurality of sub-pixels. In an example embodiment, a case, in which each pixel includes a red sub-pixel (SP_R), a blue sub-pixel (SP_B) and a green sub-pixel (SP_G), is described. FIG. 6 illustrates an interference signal of interference light detected in the red sub-pixels (SP_R). It is observed in the red sub-pixels (SP_R) that a wavelength of 660 nm corresponding to red light is dominantly detected.

Figure 7:
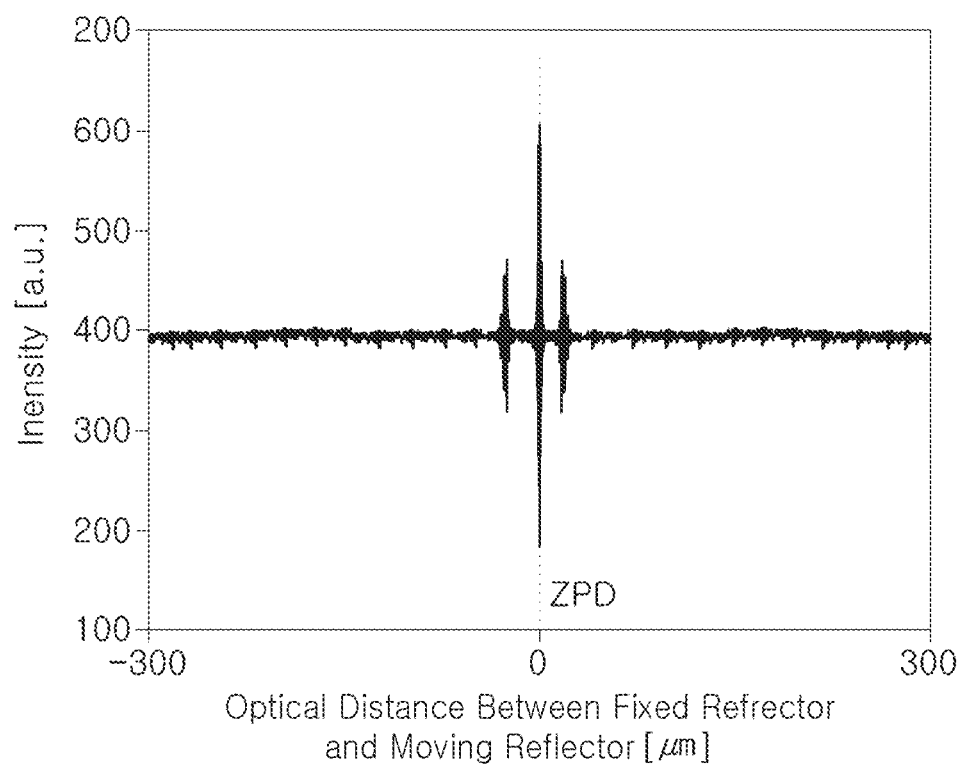
FIG. 7 is a diagram illustrating an interference signal generated in a light detector.

As a whole image of the wafer W is contained in the measurement light L2 reflected by the wafer W, interference light corresponding to each region of the wafer W may be included in the interference light L7 of the measurement light L2. Accordingly, the interference light corresponding to each region of the wafer W may be captured in a plurality of the pixels of the imaging device 210 which captured an image of the interference light L7. FIG. 7 illustrates the interference light L7 detected in any one pixel and illustrates that 3 interference patterns are shown. A longest pattern is shown at a point (zero optical path difference; ZPD) in which the optical distances of the fixed reflector 126 and the moving reflector 124 are the same.

Figure 8:
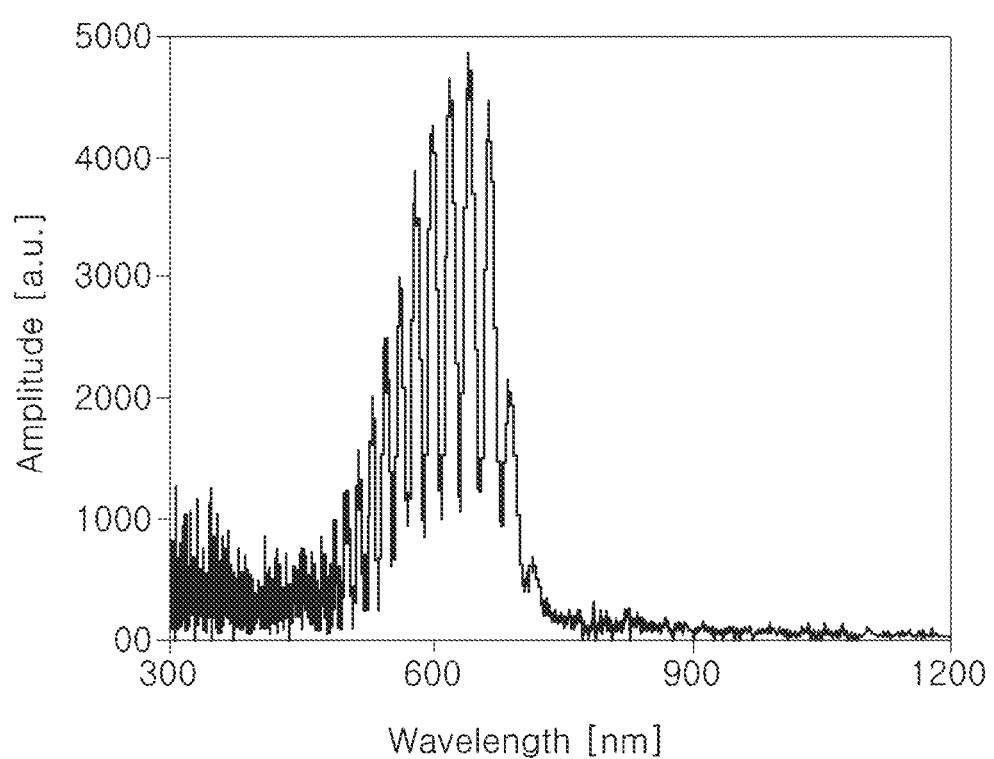
FIG. 8 is a diagram illustrating a spectrum of a measurement light.

The controller 40 can recover spectrum information for each wavelength of the measurement light based on the interference signal S provided from the light detector 200 and a location of the moving reflector 124 at a time point in which the interference signal S is captured. The controller 40 performs (and is configured to perform) Fourier transform on the interference signal S to convert a signal in a time region to a signal in a wavelength region, and calculates a distribution of films WA formed on the surface of the wafer W by detecting a portion in which a distance between highest points is different. The spectrum information for each wavelength of the measurement light may be obtained by Fourier Transformation of the interference signal S. Oscillation may be occur in the spectrum information for each wavelength of the measurement light due to the distribution of films WA formed on the surface of the wafer W. The oscillation may occur due to interference between light reflected from the surface of the films WA and light reflected from the interface between the films WA and the wafer W. Also, depending on the thickness of the films WA, interval between peak to peak of the oscillation may be changed. For example, as the thickness of the films WA becomes thicker, the interval between peak to peak of the oscillation may become narrower. Therefore, the distribution of the films WA can be calculated by measuring the interval of the peak to peak of the oscillation. If the oscillation does not occur in the spectrum information for each wavelength of the measurement light (e.g., the transmittance of the film is very low), the distribution of the films WA may be calculated by detecting a difference from a spectrum information of the standard wafer based on the reflection spectrum information of the standard wafer. FIG. 8 illustrates an interference signal, which has been processed using a Fourier transform by the controller 40.

The controller 40 may be implemented with processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The controller 40 may operate in response to control signals, commands or instructions input thereto from an external source (e.g., host, not shown) a host (not shown), and or in response to recovered spectrum information for each wavelength of the measurement light based on the interference signal S provided from the light detector 200 and a location of the moving reflector 124 at a time point in which the interference signal S is captured. Accordingly, the controller 40 may control operations of the semiconductor substrate processing apparatus 1 and semiconductor substrate measuring apparatus 2 discussed herein, thereby transforming the controller 40 into a special purpose controller 40.

As previously described, in an example embodiment, the fixed reflector 126 and the moving reflector 124 are used to form the interference light L7 based on the measurement light L2. Accordingly, a film distribution of the wafer W surface can be calculated even when a plurality of the wafers W having a big height difference are transferred in the transfer chamber. Further, during the wafer W transfer, the arm spoon 402 vertically vibrate by the vibration of the arm 401, thereby enabling the calculation of distribution of the films WA of the wafer W surface even in the case of a big height difference of the wafer W.

In an example embodiment, as the distribution of the film WA of the wafer W can be calculated in the transfer chamber 10, there is no need to transfer the wafer W to an additional measuring apparatus in order to measure the distribution of the films WA of the wafer W.

Further, in an example embodiment, when the distribution of the films WA of the wafer W processed in the process chamber 20 does not reach a standard, such an abnormality is detected before the wafer W is transferred from the transfer chamber 10. This is immediately followed by determining abnormality of the process chamber 20. Accordingly, a loss caused by a gap occurring between a time at which the film is measured to detect abnormality and a time at which the detection results are reflected to a process may be reduced.

Figure 9:
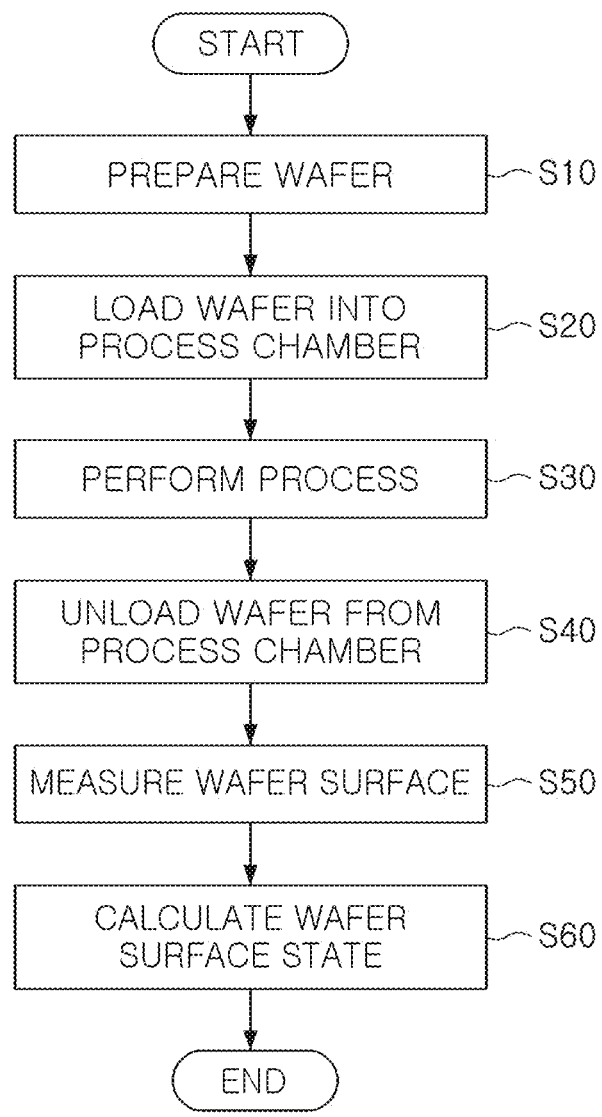
FIG. 9 is a flow chart of a method for manufacturing a semiconductor device according to an example embodiment.

A method for manufacturing a semiconductor device using the semiconductor substrate processing apparatus 1 of FIGS. 1 to 3 will now be described based on FIG. 9. FIG. 9 is a flow chart of a method for manufacturing a semiconductor device according to an example embodiment.

First, a wafer W is prepared S10. After being loaded into a loading assembly 30, the wafer W may be transferred into the transfer chamber 10 by a transfer robot 400.

The wafer W is then loaded into the process chamber 20 by the transfer robot 400 S20. When a film WA is already formed on a surface of the wafer in the previous step, the surface of the wafer W may be measured before loading into the process chamber 20.

A film WA may be formed on the wafer W in the process chamber 20 S30. Chemical vapor deposition, etching, photo cleaning, and other processes involving forming a film WA on the wafer W and processing the formed film WA may be performed in the process chamber 20.

The wafer W is then unloaded from the process chamber 2 S40, followed by measuring the surface of the wafer W S50.

The measurement of the surface of the wafer W may be performed by irradiating irradiation light L1 to the wafer W, collecting measurement light L2 reflected by the wafer W, spitting the collected measurement light L2 into first and second measurement light L3 and L4, collecting first reflected light L5 formed by reflecting the first measurement light L3 by a fixed reflector 126 and second reflected light L6 formed by reflecting the second measurement light L4 by a linearly moving reflector 124, detecting interference light L7 caused by the first and second reflected light L5 and L6, converting the detected interference light L7 to an electric signal to generate an interference signal S and extracting spectrum information for each wavelength of the measurement light L2 from the interference signal S using a distance value of a linear movement of the moving reflector 124.

The controller 40 can then calculate distribution information of the films formed on a surface of the wafer based on the spectrum information S60.

As set forth above, the semiconductor substrate measuring apparatus, the semiconductor substrate processing apparatus and semiconductor device manufacturing method using the same according to the present disclosure enables real-time detection of a state of a film formed on a semiconductor substrate moving in a transfer chamber, thereby reducing a gap occurring between a time at which the film is measured to detect abnormality and a time at which the detection results are reflected in a process.

Various advantages and beneficial effects of the present disclosure are not limited to the above descriptions and may be easily understood in the course of describing a specific example embodiment.

While example embodiments have been shown and described above, it will be apparent to those skilled in the art that modifications and variations could be made without departing from the scope of the present disclosure as defined by the appended claims.

What is claimed is:

1. A semiconductor substrate processing apparatus, comprising:
    process chambers configured to process a semiconductor substrate;
    a transfer chamber between the process chambers and configured to provide a transfer path of the semiconductor substrate;
    a transfer robot inside the transfer chamber, the transfer robot being configured to load the semiconductor substrate into the process chamber and unload the semiconductor substrate from the process chamber after processing has been performed on the semiconductor substrate in the process chamber;
    an optical assembly over the transfer path, the optical assembly configured to irradiate irradiation light having multiple wavelengths onto the semiconductor substrate,
        the optical assembly being configured to split measurement light reflected from a surface of the semiconductor substrate into first measurement light and second measurement light, the optical assembly being configured to collect interference light caused by first reflected light and second reflected light, the first reflected light formed of the first measurement light reflected by a fixed reflector and the second reflected light formed of the second measurement light reflected by a linearly moving reflector;
    a light detector configured to detect the interference light and convert the interference light into an electric signal to produce an interference signal; and
    a controller configured to extract spectrum information for each wavelength of the measurement light from the interference signal using a distance value of a linear movement of the linearly moving reflector and configured to calculate distribution information of a film on a surface of the semiconductor substrate based on the spectrum information.

2. The semiconductor substrate processing apparatus of claim 1, wherein
    the optical assembly includes a first optical assembly and a second optical assembly,
    the first optical assembly is at an upper end of the transfer chamber and configured to irradiate the irradiation light onto the semiconductor substrate to collect the measurement light, and
    the second optical assembly includes a light splitter configured to split the measurement light collected in the first optical assembly into the first measurement light and the second measurement light.

3. The semiconductor substrate processing apparatus of claim 1, wherein the fixed reflector and the linearly moving reflector include at least one of a planar mirror and a retroreflector.

4. The semiconductor substrate processing apparatus of claim 1, wherein
    the controller is configured to perform a Fourier transform on the interference signal to convert a signal of a time region into a signal of a wavelength region and
    the controller is configured to detect a portion in which a distance between highest points of the signal of the wavelength region is different.

5. The semiconductor substrate processing apparatus of claim 1, wherein
    the light detector includes an imaging device including a plurality of pixels configured to capture the interference light,
    the plurality of pixels are configured to capture the interference light as a two-dimensional interference fringe on the plurality of the pixels.

6. The semiconductor substrate processing apparatus of claim 1, wherein the light detector is configured to detect the interference light at least twice while the linearly moving reflector performs a reciprocating movement.

7. A semiconductor substrate measuring apparatus, comprising:
    a light source device configured to produce irradiation light of multiple wavelengths;
    a transfer chamber having an internal space and configured to have a semiconductor substrate transferred therein,
    a first optical assembly at an upper end of the transfer chamber, the first optical assembly configured to irradiate the irradiation light onto the semiconductor substrate and to collect measurement light reflected from a surface of the semiconductor substrate;
    a second optical assembly configured to split the measurement light into first measurement light and second measurement light, and collecting first reflected light formed of the first measurement light reflected by a fixed reflector and second reflected light formed by reflecting the second measurement light by a moving reflector performing a reciprocating movement in a desired distance;
    a light detector configured to detect interference light caused by the first reflected light and the second reflected light, the light detector being configured to convert the interference light to an electric signal to produce an interference signal; and a controller configured to extract spectrum information for each wavelength of the measurement light from the interference signal using a distance value of a linear movement of the moving reflector and the controller being configured to calculate distribution information of a film formed on a surface of the semiconductor substrate based on the spectrum information.

8. The semiconductor substrate measuring apparatus of claim 7, wherein the second optical assembly further includes a light splitter configured to split the measurement light into the first measurement light and the second measurement light, and the fixed reflector and the moving reflector are spaced apart from the light splitter in a same optical distance.

9. The semiconductor substrate measuring apparatus of claim 8, wherein the light splitter is configured to split the first measurement light and the second measurement light in an intersecting direction.

10. The semiconductor substrate measuring apparatus of claim 8, wherein the light splitter has a same ratio of reflection and transmission.

11. The semiconductor substrate measuring apparatus of claim 8, wherein the moving reflector is configured to reciprocate about a point having an optical distance equal to the optical distance of the fixed reflector.

12. The semiconductor substrate measuring apparatus of claim 7, wherein the second optical assembly further including a linear stage configured to employ linearly reciprocally moving the moving reflector, and the linear stage is configured to reciprocate along an optical axis direction of the second measurement light.

13. The semiconductor substrate measuring apparatus of claim 12, wherein the linear stage includes at least one of a piezo motor and a voice coil motor.

14. The semiconductor substrate measuring apparatus of claim 7, wherein the first measurement light and the second measurement light have an optical path difference within a coherence length.

15. The semiconductor substrate measuring apparatus of claim 7, wherein the light detector includes an imaging device configured to capture the interference light, the imaging device includes at least one of a charge coupled device (CCD) sensor and a complementary metal-oxide semiconductor (CMOS) sensor including a plurality of pixels.

16. The semiconductor substrate measuring apparatus of claim 15, wherein the plurality of pixels are configured to capture the interference light as a two-dimensional interference fringe on the plurality of pixels.

17. A method for manufacturing a semiconductor device, comprising:

transferring a semiconductor substrate to a transfer chamber;

loading the semiconductor substrate into a process chamber;

forming a film on the semiconductor substrate by processing the semiconductor substrate in the process chamber;

unloading the semiconductor substrate from the process chamber;

irradiating irradiation light onto the semiconductor substrate and collecting measurement light reflected on the semiconductor substrate;

splitting the measurement light into first measurement light and second measurement light;

collecting first reflected light and second reflected light,
the first reflected light formed of the first measurement light reflected by a fixed reflector, and
the second reflected light formed of the second measurement light reflected by a linearly moving reflector;

detecting interference light caused by the first reflected light and the second reflected light;

converting the detected interference light into an electric signal to generate an interference signal;

extracting spectrum information for each wavelength of the measurement light from the interference signal using a distance value of a linear movement of the linearly moving reflector; and calculating distribution information of the film on the semiconductor substrate based on the spectrum information.

18. The method of claim 17, wherein the linearly moving reflector is configured to perform a reciprocal movement along an optical axis direction of the second measurement light.

19. The method of claim 17, wherein the first measurement light and the second measurement light have an optical path difference within a coherence length.

20. The method of claim 17, wherein the interference light is converted to an electric signal at least twice while the linearly moving reflector performs a reciprocal movement once.

* * * * *